United States Patent
Ito

(10) Patent No.: US 7,107,569 B2
(45) Date of Patent: Sep. 12, 2006

(54) DESIGN METHOD AND APPARATUS FOR A SEMICONDUCTOR INTEGRATED CIRCUIT COMPRISING CHECKERS VERIFYING THE INTERFACE BETWEEN CIRCUIT BLOCKS

(75) Inventor: Masaki Ito, Machida (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/770,479

(22) Filed: Feb. 4, 2004

(65) Prior Publication Data

US 2004/0158803 A1  Aug. 12, 2004

Related U.S. Application Data

(63) Continuation of application No. 10/083,341, filed on Feb. 27, 2002, now Pat. No. 6,708,322.

(30) Foreign Application Priority Data

Jun. 6, 2001 (JP) .............................. 2001-170636

(51) Int. Cl.
*G06F 17/50* (2006.01)
(52) U.S. Cl. .............................. 716/18; 716/5; 716/11; 703/20
(58) Field of Classification Search .................. 716/18, 716/11, 5; 703/20
See application file for complete search history.

(56) References Cited

U.S. PATENT DOCUMENTS

| 5,453,936 | A | | 9/1995 | Kurosawa |
| 5,493,507 | A | * | 2/1996 | Shinde et al. .................. 703/14 |
| 5,953,519 | A | * | 9/1999 | Fura ............................ 716/18 |
| 5,963,454 | A | | 10/1999 | Dockser |
| 6,675,310 | B1 | * | 1/2004 | Bloom et al. ................ 713/500 |
| 6,678,645 | B1 | * | 1/2004 | Rajsuman et al. ............. 703/20 |

FOREIGN PATENT DOCUMENTS

JP       2000-123064       10/1998

* cited by examiner

*Primary Examiner*—A. M. Thompson
(74) *Attorney, Agent, or Firm*—Reed Smith LLP; Stanley P. Fisher, Esq.; Juan Carlos A. Marquez, Esq.

(57) ABSTRACT

A functional block for verifying correct interface operation of any functional block is generated from interface description and installed on a LSI chip. To accomplish this, from the interface description, hardware description of a synthesizable interface checker is generated. Means for selecting interface functions to be checked is provided, thereby making it possible to reduce the overhead of circuits to be installed on the LSI.

5 Claims, 14 Drawing Sheets

Logic simulation/
Logic emulation model

FIG. 10

```
define interface simple_memory;
define port;
   input.clock   clk;
   input.control rst_n;
   input.control rw;
   input.control en_n;
   input.data [7:0]  addr;
   output.control  wait_n;
   inout.data [7:0]  d;
endport define alphabet;
   signal set={ clk, rst_n, en_n, rw, addr, wait_n, d };
   NOP:       { posedge, 1, 1, *, *, 1, Z };
   RST:       { posedge, 0, *, *, *, *, Z };
   RREQ(Xa):{ posedge, 1, 0, 1, $i.Xa, 1, Z };
   RWAIT:     { posedge, 1, 1, *, *, 0, Z };
   ROUT(Xd):{ posedge, 1, 1, *, *, 1, $o.Xd };
endalphabet define word;
   void nop : NOP NOP*;
   void reset : RST RST*;
   data(Xd) byte_read(Xa):RREQ(Xa) RWAIT RWAIT ROUT(Xd);
endword define sentence;
   reset [ reset | nop | byte_read(Xa) ]*;
endsentence
endinterface
```

Edge without name is ε transition

FIG. 13

```
`define NOP(nstate) if ((clk == 1)&&(rst_n == 1)&&(en_n == 1)&&(wait_n == 1))\
               begin\
                  state <= nstate;\
               end else\

`define RST(nstate) if ((clk == 1)&&(rst_n == 0))\
               begin\
                  state <= nstate;\
               end else\

`define RREQ(nstate) if ((clk == 1)&&(rst_n == 1)&&(en_n == 0)&&(rw == 1)\
               && (wait_n == 1))\
               begin\
                  state <= nstate;\
               end else\

`define RWAIT(nstate) if ((clk == 1)&&(rst_n == 1)&&(en_n == 1)&&(wait_n == 0))\
               begin\
                  state <= nstate;\
               end else\

`define ROUT(nstate) if ((clk == 1)&&(rst_n == 1)&&(en_n == 1)&&(wait_n == 1))\
               begin\
                  state <= nstate;\
               end else\

`define REJECT begin reject <= 1'b1; state <= `reject_state; end

`define initial_state 3'h0
`define reject_state 3'h7
`define s1 3'h1
`define s2 3'h2
`define s3 3'h3
`define s4 3'h4
`define s5 3'h5
```

FIG. 14

```
module simple_memory( clk, rst_n, rw, en_n,
addr, wait_n, d, reject );
input clk, rst_n, rw, en_n, addr, wait_n, d;
wire clk;
wire rst_n;
wire rw;
wire en_n;
wire [7:0] addr;
wire wait_n;
wire [7:0] d;
reg reject;
reg [2:0] state;
always @(posedge clk) begin
  case(state)
  `initial_state: begin
    reject <= 1'b0;
    `RST(`s2)
    begin end
  end
  `s1: begin
    `RST(`s2)
    `REJECT
  end
  `s2: begin
    `RST(`s2)
    `NOP(`s2)
    `RREQ(`s3)
    `REJECT
  end
  `s3: begin
    `RWAIT(`s4)
    `REJECT
  end
  `s4: begin
    `RWAIT(`s5)
    `REJECT
  end
  `s5: begin
    `ROUT(`s2)
    `REJECT
  end
  default: begin
    state <= `initial_state;
    reject <= 1'b0;
  end
  end
end
endmodule
``` though the problem thereof. When designing functional blocks constituting an LSI, each block is produced, based on

DESIGN METHOD AND APPARATUS FOR A SEMICONDUCTOR INTEGRATED CIRCUIT COMPRISING CHECKERS VERIFYING THE INTERFACE BETWEEN CIRCUIT BLOCKS

This application is a Continuation of non-provisional U.S. application Ser. No. 10/083,341 filed Feb. 27, 2002 now U.S. Pat. No. 6,708,322. Priority is claimed based on U.S. application Ser. No. 10/083,341 filed Feb. 27, 2002, which claims the priority of Japanese application 2001-170636 filed on Jun. 6, 2001.

BACKGROUND OF THE INVENTION

The present invention relates to logical integrated circuit (IC) and system LSI chips that are constructed by assembling a plurality of logical blocks into a chip, a method of designing such chips and a method of mass production thereof.

When designing logical IC and system LSI chips, such a design method has conventionally been used that comprises dividing the whole functionalty into multiple functional blocks, designing each block, and assembling all blocks into the chip. A design method reusing functional blocks that have been designed beforehand and retained as Intellectual Properties (IPs) has lately been known. A corporation manufacturing IC and LSI chips may buy such blocks of IPs of another corporation in addition to using in-house designed IPs.

When constructing a system LSI chip by assembling its functional blocks into the chip, it is required for each block that signal inputs and outputs take place in conformity with the block interface specifications to make the functional block properly function, wherein the interface means passing input/output signals from one block to another block and vice versa. As a method of determining whether inputting and outputting signals to/from each functional block conform to the interface specifications, the following method is known. To a logic simulation model for a system LSI as a whole, a block is added that monitors input/output signals to/from each functional block and determines whether they occur at correct timing, according to the specifications, during the logic simulation. When the logic simulation model runs, the above determination is made.

Meanwhile, there exists a method of describing the interface specifications of functional blocks, for example, the one disclosed in Japanese Patent Laid-Open Publication (Kokai) No. 2000-123064. In this method disclosed, alphabets are assigned to values of signals in combinations passing across a functional block interface and the interface is defined as a set of sequences of alphabets. As the notation of a sequence and the notation of a set of sequences thereof, regular exprssion is used so that a variety of interface definitions can be described by a small quantity of code. Hereinafter, this notation will be referred to as interface notation of Kokai 2000-123064.

As methods for detecting defective or faulty LSIs due to errors in the fabrication process or after the fabrication, a Build-In Self Test (BIST) and an online test are known. These methods provide each LSI with a function of testing for its proper operation. The BIST runs the LSI in test mode different from normal operation and checks for a fault. The online test checks for a fault during normal operation of the LSI. By these test functions, a fault existing in a logical design block of IP can be detected.

SUMMARY OF THE INVENTION

After constructing a system LSI by assembling a plurality of functional blocks into the chip, logic simulation has conventionally been applied to verify the functions of the LSI. However, it takes exceedingly much time to complete the logic simulation and this poses a problem that the simulation is usually terminated halfway before verifying all functions. In consequence, there remains a risk that an LSI malfunctions after it is fabricated. If the LSI malfunctions, a defective element causing the malfunction should be located and rectified. When a functional block is suspected to have failed to operate as expected, it must be determined whether the cause is a design error of the functional block thereof or incorrect usage of the functional block thereof causing operation out of its specifications. It must be determined that the object to be rectified is the functional block or an external block using the functional block.

In view hereof, signals appearing at the interface of the functional block should be monitored and the passage of the input/output signals in accordance with the specifications of the functional block should be verified during the logic simulation to be executed before the LSI fabrication. This is accomplished by the interface checking block added to the logic simulation to run. However, it takes exceedingly much time to complete the logic simulation as described above, it is impossible to execute the logic simulation for all possible logic patterns. Thus, the interface cannot be checked completely.

Meanwhile, the above interface checking block aims at the enhancement of the efficiency of logic simulation and therefore its description focuses on only the efficiency of simulation and ignores logic synthesis for installing it on an LSI. Such description does not allow for incorporating its hardware composed of logic circuits into an LSI. Consequently, there has not existed means for locating a design error included in a fabricated system LSI by discriminating between the error of a functional block and the error of an external block using the functional block.

Addressing the above-described challenges, an object of the present invention is to provide means for determining whether any functional block included in a system LSI has a design error or is used by incorrect usage in the event that the system LSI malfunctions after fabricated.

Test data to be used for the above-mentioned BIST and online test as means for detecting a malfunction of a system LSI after its fabrication is generated, based on design data. Even if design data includes an error causing a mulfunction, the test data is generated from it on the assumption that it is correct. This poses a problem that a malfunction due to a design error cannot be detected by the BIST and online test.

The present invention provides means for describing an interface checking block (interface checker) in a hardware description manner in which to allow for logic synthesis, thereby making it possible to incorporate the interface checker into a fabricated system LSI, wherein the interface checker to which the interface specifications described per functional block of the LSI are input determines whether the input/output signals to/from a functional block conform to the interface specifications of the functional block.

BRIEF DESCRIPTION OF THE DRAWINGS

FIG. 10 represents an example of interface description for a functional module having the interface functions shown in FIG. 9.

FIG. 13 represents macro definitions of the synthesizable interface checker generated from the interface description shown in FIG. 10.

FIG. 14 represents an example of hardware description of the synthesizable interface checker corresponding to the definitions shown in FIG. 13.

DESCRIPTION OF THE PREFERRED EMBODIMENTS

Figure 1:
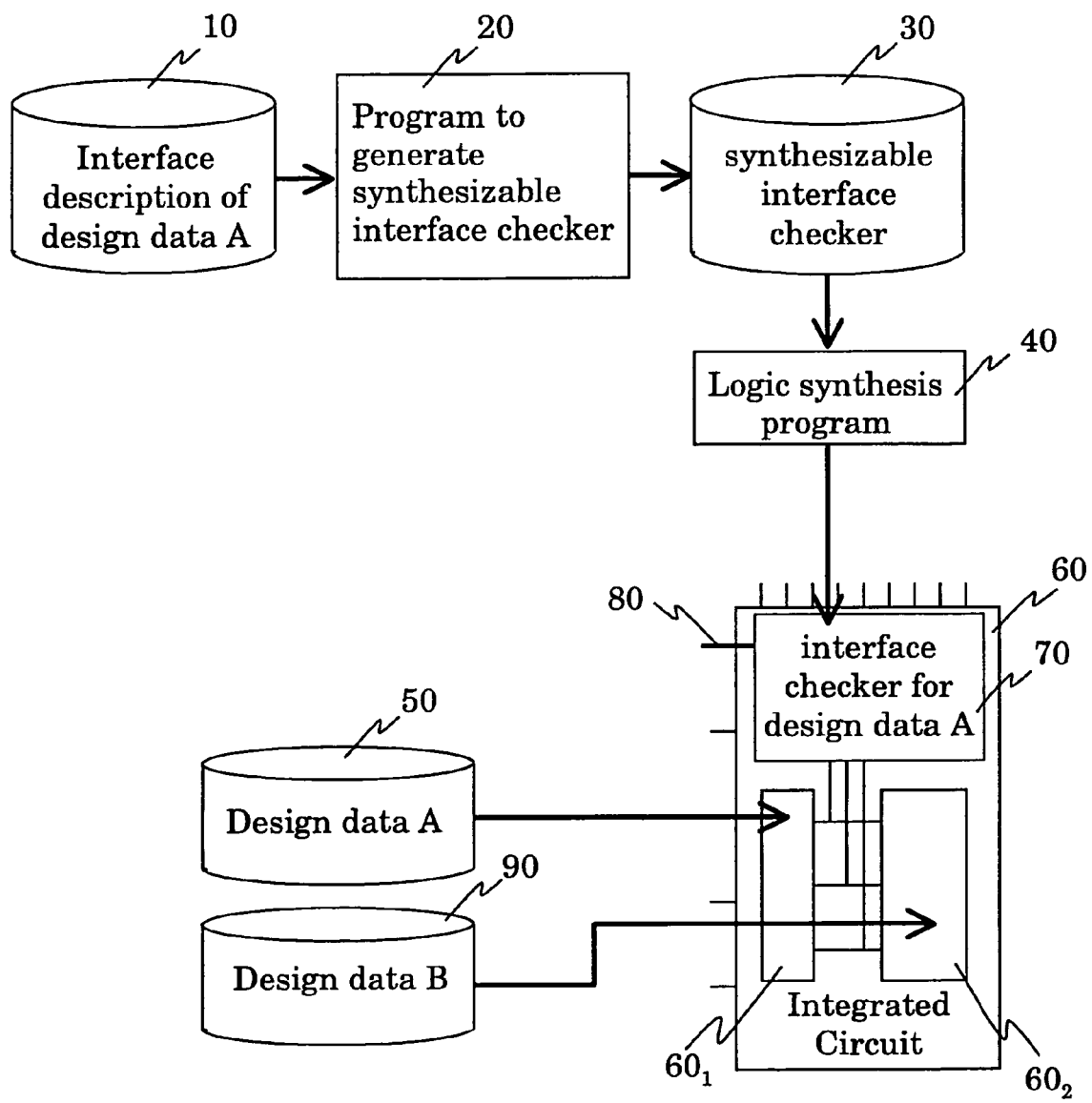
FIG. 1 is a diagram for explaining a preferred embodiment of the present invention.

FIG. 1 is a diagram for explaining a preferred embodiment of the present invention. In FIG. 1, reference numeral 60 denotes a semiconductor integrated circuit chip into which functional blocks (IPs) $60_1$ and $60_2$ are integrated, which are schematically represented, and signals are passed between the blocks and input/output pins are properly arranged on the edges of the circuit. The IP $60_1$ is a functional block designed, based on design data A and the IP $60_2$ is that designed, based on design data B, indicated by the bold arrows from the storage units 50 and 90 for respective design data. Into the semiconductor integrated circuit chip 60, an interface checker 70 for design data A is also integrated, which is a feature of the present invention. The structure of the interface checker will be described later. Because this embodiment intends to illustrate discriminating between a error of the IP $60_1$ and a error of an external functional block using IP $60_1$, the interface checker 70 is assumed checking design data A. Reference numeral 80 denotes an external output pin for informing the external of whether the IP performs well as determined by the interface checker 70.

Reference numeral 10 denotes a storage unit in which interface description of design data A is stored, 20 denotes a program to generate a synthesizable interface checker, and 30 denotes a storage unit in which hardware description of the synthesizable interface checker is stored. Reference numeral 40 denotes a logic synthesis program that synthesizes logic circuit from the hardware description stored in the storage unit 30. The design data A stored in the storage unit 50 is designed, based on the interface description of design data A stored in the storage unit 10.

The above interface checker 70 for design data A is composed of logic circuits incorporated into the semiconductor integrated circuit chip 60. The logic circuits are generated by the logic synthesis program 40 from the hardware description of the interface checker generated by the program to generate a synthesizable interface checker 20, based on the interface description of design data A stored in the storage unit 10. The wording "synthesizable" used herein means that the interface checker can be generated as the hardware composed of logic circuits. In other words, the interface checker of the present invention can be incorporated into the LSI in contrast with the conventional interface checking block whose description focuses on only the efficiency of simulation and ignores logic synthesis for installing it on the LSI in order to enhance the efficiency of logic simulation.

Figure 9:
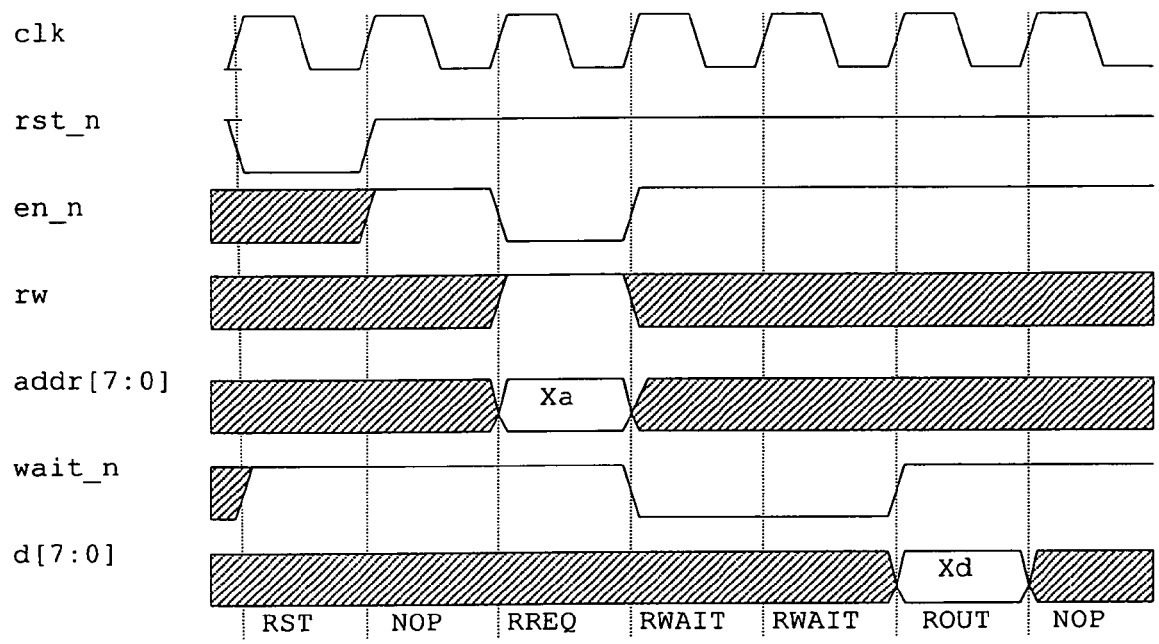
FIG. 9 represents exemplary interface functions of a functional module.

The interface description 10 is the data describing the interface specifications for design data A. This data can be described by using known notation, for example, the above-mentioned interface notation of Kokai 2000-123064, though varying, according to the language used for describing the data. Exemplary interface functions that are described in the interface description 10 are shown in FIG. 9. Normally, the interface description describes timing information in synchronization with a clock as shown in FIG. 9. FIG. 9 represents the states of the protocol controlling signals changing with the clock pulses when data is read from memory. FIG. 9 simply represents the changing states of the protocol controlling signals and it is not seen from only these states that the function of reading data from memory is implemented. However, because it is seen that design data A behaves, according to this interface specification, the other block operating with design data B to/from which signals are passed from/to the block operating with design data A must implement the same interface specification as well.

The interface description 10 describes all interface functions to be implemented for design data A as shown in FIG. 9. The program to generate a synthesizable interface checker 20 reads the interface description 10, and generates and outputs hardware description of the synthesizable interface checker for design data A. This hardware description is stored into the storage unit 30. The hardware description of the synthesizable interface checker is hardware description to the extent that the logic synthesis program 40 can logically synthesize the interface checker. It describes the functions of monitoring the input/output signals of design data A and determining whether the signals occur in conformity with the interface description 10 of design data A. The hardware description to the extent the interface checker can logically be synthesized is defined in, for example, IEEE Standard for VHDL Register Transfer Level (RTL) Synthesis, IEEE Std. 1076.6-1999. Operation of the program to generate a synthesizable interface checker 20 will be illustrated later.

The hardware description of the synthesizable interface checker stored in the storage unit 30 is synthesized by the logic synthesis program 40 into gate level description in which the interface checker is embodied as hardware. Thereby, the interface checker for design data A can be installed on the hardware chip and the LSI 60 including the interface checker 70 can be provided. In the event that the waveform of an input/output signal of design data A that does not conform to the interface description 10 of design data A appears, the interface checker 70 drives the external output pin 80 to inform the external of that event. The pin should be arranged to output a value of 0 during correct operation and a value of 1 when an incorrect event occurs.

Figure 2:
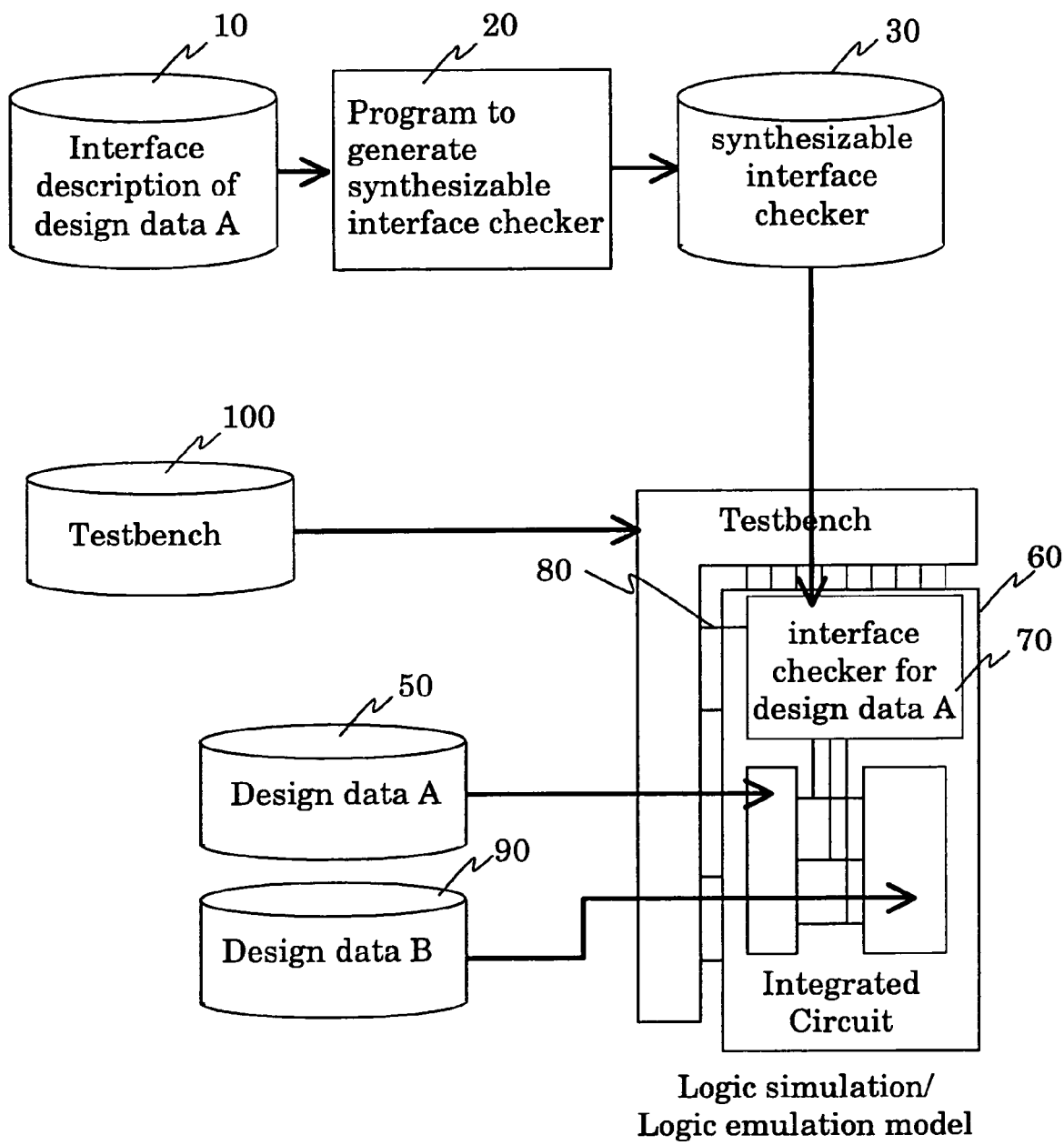
FIG. 2 is conceptual diagram of another preferred embodiment of the invention.

In another preferred embodiment of the invention shown in FIG. 2, the hardware description of the synthesizable interface checker stored in the storage unit 30 can be used as is for simulation. This hardware description, testbench description stored in a storage unit 100, design data A stored in a storage unit 50, and design data B stored in a storage unit 90 are input to a logic simulator/emulator model, and then this model can execute logic simulation. Because the interface checker has conventionally taken the simulation efficiency as important and ignored logic synthesis capability, it has been impossible to use the interface checker for a run model for a logic emulator that is specialized hardware. In the present invention, because the hardware description of the synthesizable interface checker can be synthesized, the interface checker can be incorporated into a run model for logic emulator and high-speed logic verification can be performed.

Figure 3:
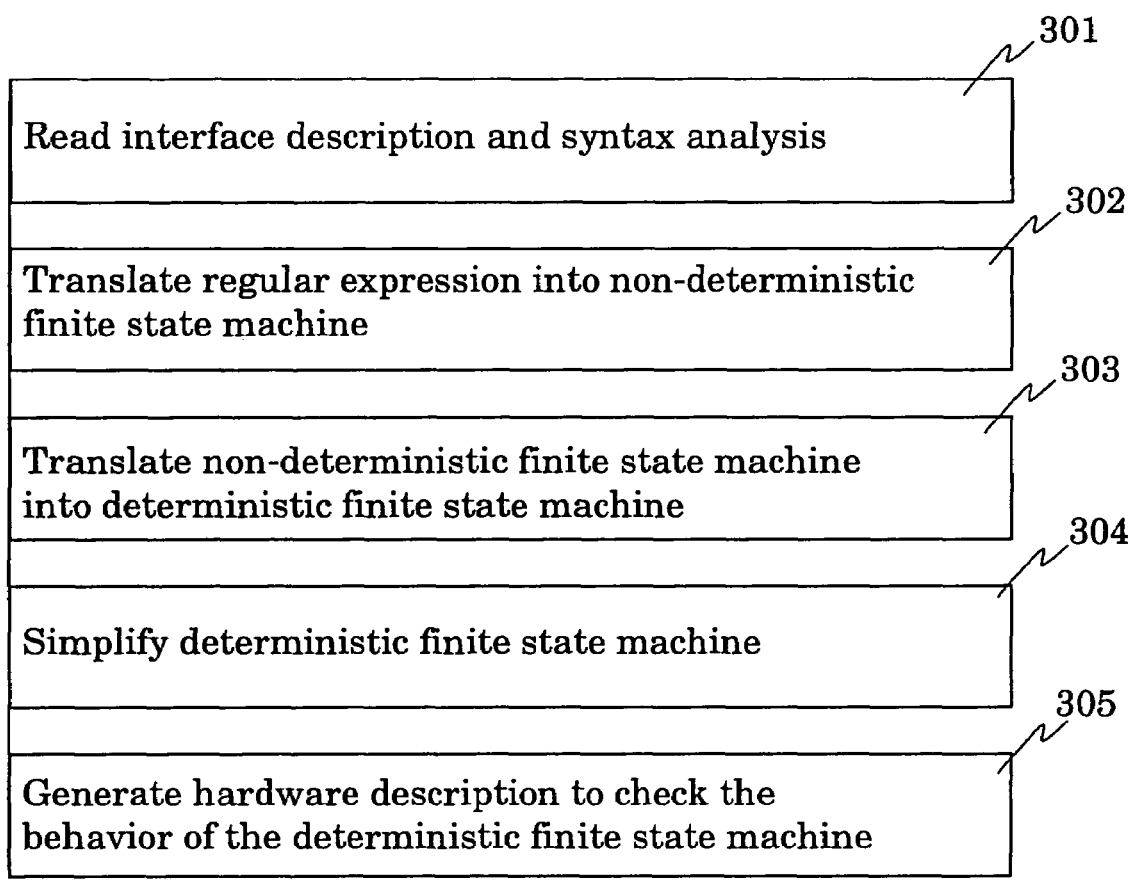
FIG. 3 represents a process flow of a preferred embodiment of the present invention.

Then, the operation of the program to generate a synthesizable interface checker 20 will be explained. An illustrative operation flow of the simplest process is represented in FIG. 3. The program 20 first reads the interface description 10 and executes syntax analysis (step 301). Information to be described in the interface description 10 includes the following:

(1) Name declarations of signals passing across the interface
(2) Directions of the signals (input or output direction or bidirectional)
(3) Widths of the signals (in units of bits)
(4) Specified clock signal
(5) Specified control signals
(6) Specified data signals
(7) Function names
(8) A set of the simultaneous values of the control signals per clock cycle for each function
(9) A range of effective clock cycles specified for a data signal for each function and the direction in which the signal passes for bidirectional signals.

For example, the interface notation of Kokai 2000-123064 satisfies the above information requirements. Using the interface notation of Kokai 2000-123064, for example, the waveforms of the signals shown in FIG. 9 can be described as will be shown in FIG. 10. The data signal waveform shown in FIG. 9 is named "byte_read" in FIG. 10.

The description example shown in FIG. 10 for the signals shown in FIG. 9 describes read operation of a simple memory interface, wherein values that the signals will assume when data is read from memory are described in time sequence.

The program 20 reads the interface description exemplified in FIG. 10 and executes syntax analysis. In the following, synthesizable interface checker description to be output will be described in a Verilog hardware description language, though equivalent description is possible with another language. For the values of the signals described in the alphabetical definition section, first, the alphabetical values are translated into macro values, thereby generating macro description. In FIG. 10, for example, the NOP state is the combination of the following signals.

clk=posedge, rst_n=1, en_n=1, rw=*,
addr=*, wait_n=1, d=Z

Figure 12:
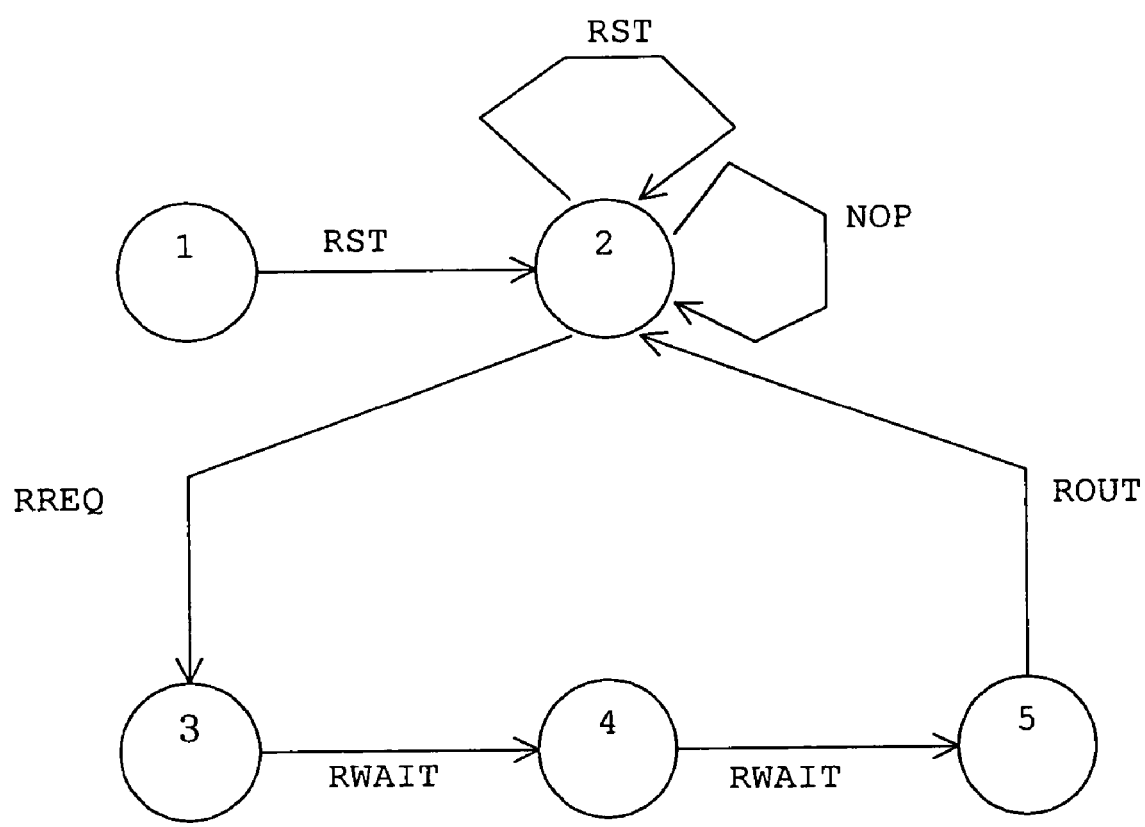
FIG. 12 represents another state transition graph example in a simplified form of the state transition graph shown in FIG. 11.

These values are translated into macro values in the Verilog hardware description language as follows:
define NOP (nstate) if ((clk==1' b1) && (rst_n==1' b1) && (en_n==1' b1) && (wait_N==1' b1)) begin state<=nstate: end else Hereon, while the clock signal value, posedge indicates the rise from 0 to 1, the clock has a value of 1 after the rise in macro. In principle, posedge is permitted only for a signal for which the clock attribute is defined in the port definition section. The macro description does not include signals having a value of * or Z. After all alphabetical values are replaced by macro values, special macro definition REJECT is described as follows:
define REJECT begin reject<=1' b1; state<=reject_state; end Moreover, states of a finite state machine are defined in macro. In this definition, the following special states are defined: macro name initial_state as a value of 0 and reject_state as all bits 1. FIG. 12 shows a finite state machine representation, wherein the machine can be placed in one of five states plus the above two special states, that is, seven states, and therefore the states can be defined in three bits. Specifically, definition is described is as follows:
define initial_state 3' h0
define reject_state 3' h7
define s1 3' h1
define s2 3' h2
...
...
define s5 3' h2

The above macro definitions are shown in FIG. 13. The reason why macro description is used is making the code more intelligible for a person to read. While the alphabetical notation is translated, it is possible to generate macro-expanded description directly without using macro.

Figure 11:
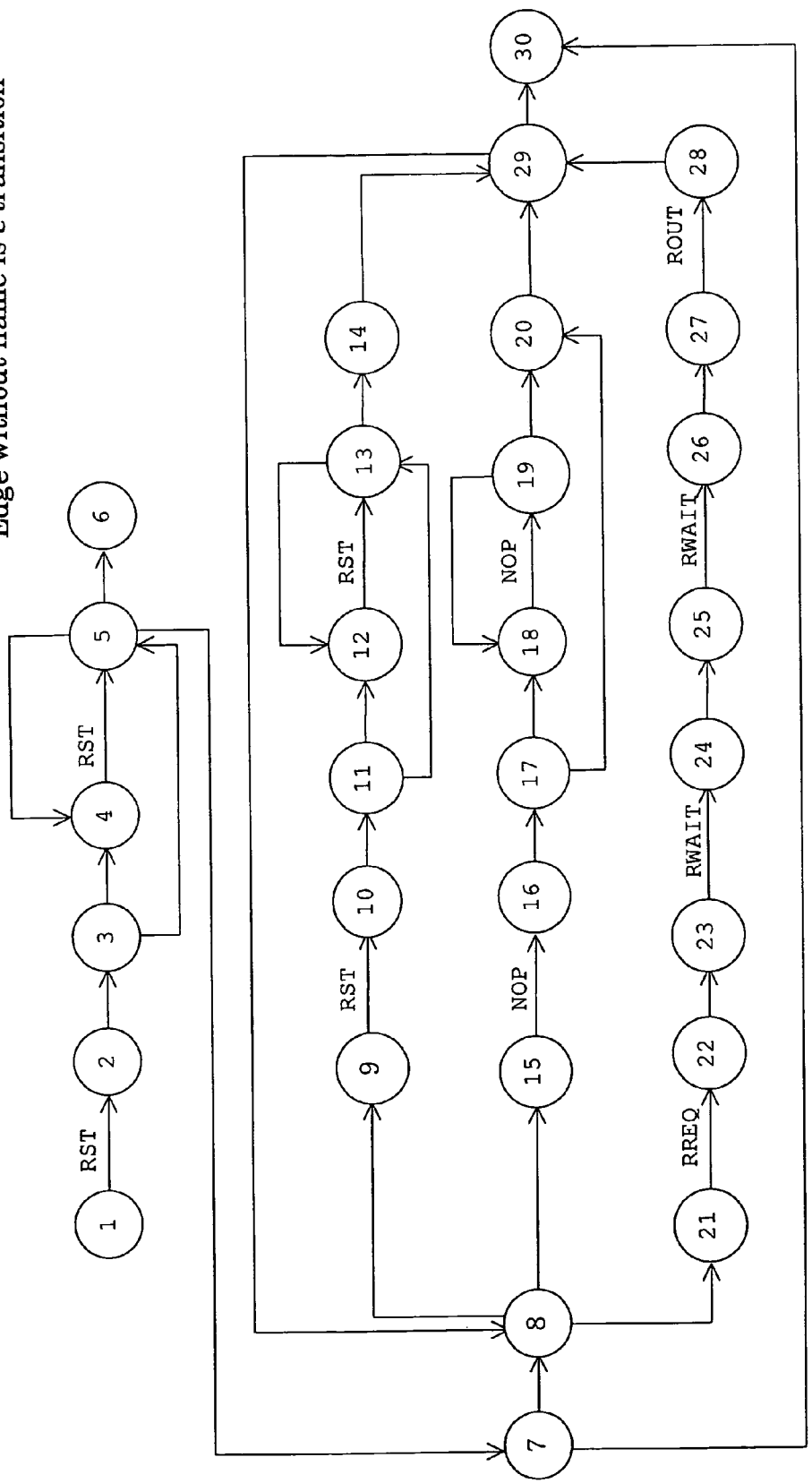
FIG. 11 represents a state transition graph example obtained by translating the interface description shown in FIG. 10 into non-deterministic finite state machine representation.

Because the word definition section of the interface description is described in regular expression, it can be translated into equivalent non-deterministic finite state machine representation. For example, the word description illustrated in FIG. 10 is translated into non-deterministic finite state machine representation (step 302) as will be shown in FIG. 11. Because this finite state machine is non-deterministic as one of input sequences may pass along a plurality of paths, it is translated into deterministic finite state machine and simplified (step 304). Translating normalized description into non-deterministic finite state machine representation, translating the non-deterministic finite state machine representation into deterministic finite state machine representation, and simplification algorithms are described in general publications. Simplification does not affect the operation of the finite state machine and may or may not be carried out. The non-deterministic finite state machine representation shown in FIG. 11 is translated into the deterministic finite state machine representation and simplified, and thereby, the finite state machine representation shown in FIG. 12 is obtained.

The deterministic finite state machine representation can easily be translated into a hardware description language such as Verilog or a software programming language such as C.

The following is detailed description of a method of translating the interface description shown in FIG. 10 into hardware description which is described in Verilog as an example, as will shown in FIG. 14.

FIG. 14 exemplifies hardware description in which the deterministic finite state machine representation shown in FIG. 12 is described in Verilog, using the macro definitions shown in FIG. 13. The alphabetical values in the alphabetical definition section are first translated into macro values as described above, thereby generating macro definitions shown in FIG. 13.

Then, writing code of the module in Verilog will be explained below. As the module name, specify the name defined in the interface declarative section of the interface description. As the port signals, write all signals defined in the port declarative section of the interface description and reject sequentially. For example, seven signals clk, rst_n, rw, en_n, addr, wait_n, and d are described in FIG. 10. Write the module name and port signals in sequence as follows:

module simple_memory (clk, rst_n, rw, en_n, addr, wait_n, d, reject);

Then, write all signals defined in the port declarative section in sequence as input. Thereby, the following line is generated:

input clk, rst_n, rw, en_n, addr, wait_n, d;

Moreover, specify wire types of signals not having width and wire [n:m] types of signals having width (addr and d in this example), where, to n and m, the respective values declared in the port declarative section are assigned (7 and 0 are assigned to n and m, respectively, for both the addr and d signals in this example). Thereby, the following lines are generated:

wire clk, rst_n, rw, en_n, wait_n;

wire [7:0] addr, d:

Then, declare a state register to retain a specific state. In this declaration, specify a bit width that is the minimum integer not less than a logarithm whose base is a value, namely 2, added to the number of states predefined for the finite state machine. Five states are predefined for the finite state machine shown in FIG. 12 and all possible states in one of which the machine can be placed, including special states are 5+2=7. Hence, the minimum integer not less than the logarithm whose base is 2 is 3, and write:

reg [2:0] state:

Then, declare a reject signal that indicates that a signal not conforming to the interface specifications has appeared for output and reg. This signal is output to the pin 80 shown in FIG. 1 or 2.

output reject;

reg reject;

Furthermore, write code for module internal operation. Only one process is to be carried out by the module. The module executes the process every clock pulse rise if the value of the clock attribute signal declared in the port declarative section is posedge in the alphabetical definition or every clock pulse fall if the above value is negedge. Because this value is posedge in the interface description shown in FIG. 10, write:

always @ (posedge clk) begin

If the alphabetical value is negedge, posedge in the above line is replaced by negedge.

Then, write code for operation by state transition. Because the operation of the finite state machine changes, according to the state, first write code for checking the state.

case (state)

Then, write code for operation in the initial state, beginning with initial_state that is different from initial state 1 of the finite state machine shown in FIG. 12. Transition from the initial state is assumed the same as transition from initial state 1 shown in FIG. 12. That is, as initial state 1 changes to state 2 by RST in FIG. 12, the initial state described as initial_state also changes to state 2 by RST. Transition terminating with the state initial_state is impossible.

Operation to be performed in the state initial_state is initializing the reject output signal to a value of 0. From the above, using the macros shown in FIG. 13, the following lines can be generated.

initial_state: begin
reject<=1' b0;
RST (s2)
begin end
end

Then, write code for state transition for each state of the finite state machine shown in FIG. 12. For each state, write code for possible transitions from the state and write macro REJECT at the end. For, for example, state 2, the state 2 remains as is when the RST or NOP signal comes in and changes to state 3 when the RREQ signal comes in and, therefore, write the following:

s2: begin
RST (s2)
NOP (s2)
RREQ (s3)
REJECT
end

After writing code for state transitions for all states, write the following lines:

default: begin
state<=initial_state:
reject<=1' b0;
end

The code description for the process and module operation ends with:

end
end module

The hardware description is then completed. That is, generating hardware description to check the operation of the deterministic finite state machine (step 305) is done.

In this way, the macro definitions shown in FIG. 13 and the operation description shown in FIG. 14 can be generated from the finite state machine shown in FIG. 12. According to the operation description shown in FIG. 14, the interface checker can be synthesized.

Through the procedure described above, the synthesizable interface checker can be generated from the interface description.

Business expected to develop from the present invention includes not only manufacturing and marketing LSIs in which the interface checker of the invention is incorporated, but also supplying hardware description of the synthesizable interface checker. The hardware description supply business can be realized as follows. The business operator offers design data or design data interfaces that can be supplied to LSI manufacturers or vendors (hereinafter referred to as the user). By the user request for desired design data and interface specifications, the business operator supplies a synthesizable interface checker and its hardware description meeting the specifications to the user, for which the user pays charges to the business operator. It is, of course, advisable for the business operator to offer a line of design data or design data interfaces that can be accommodated to the user to allow the user to specify design data or a design data interface.

As illustrated in FIG. 3, the interface description containing information to be described to construct hardware is input to the program to generate a synthesizable interface checker and the hardware description of the synthesizable interface checker can be generated by the program. Therefore, in the above business, charging can be arranged so that the user is charged, according to the complexity of the interface description, in other words, the complexity of the hardware description of the synthesizable interface checker to be supplied to the user.

While program packages available on the market are generally priced on a program-by-program basis, in the case of the program of the present invention, the more complex the operation of the interface checker to be generated, the more beneficial for the user will be the hardware description of the synthesizable interface checker that is automatically generated. Therefore, the business is realized, based on charging for program use, according to the complexity of the description to be generated. In one preferred embodiment of a charging scheme, an index of complexity is the number of lines of the interface checker description generated or the number of states defined for the finite state machine, depending on which the generated interface checker operates. The business will be feasible, based on the charging according to such index.

Figure 4:
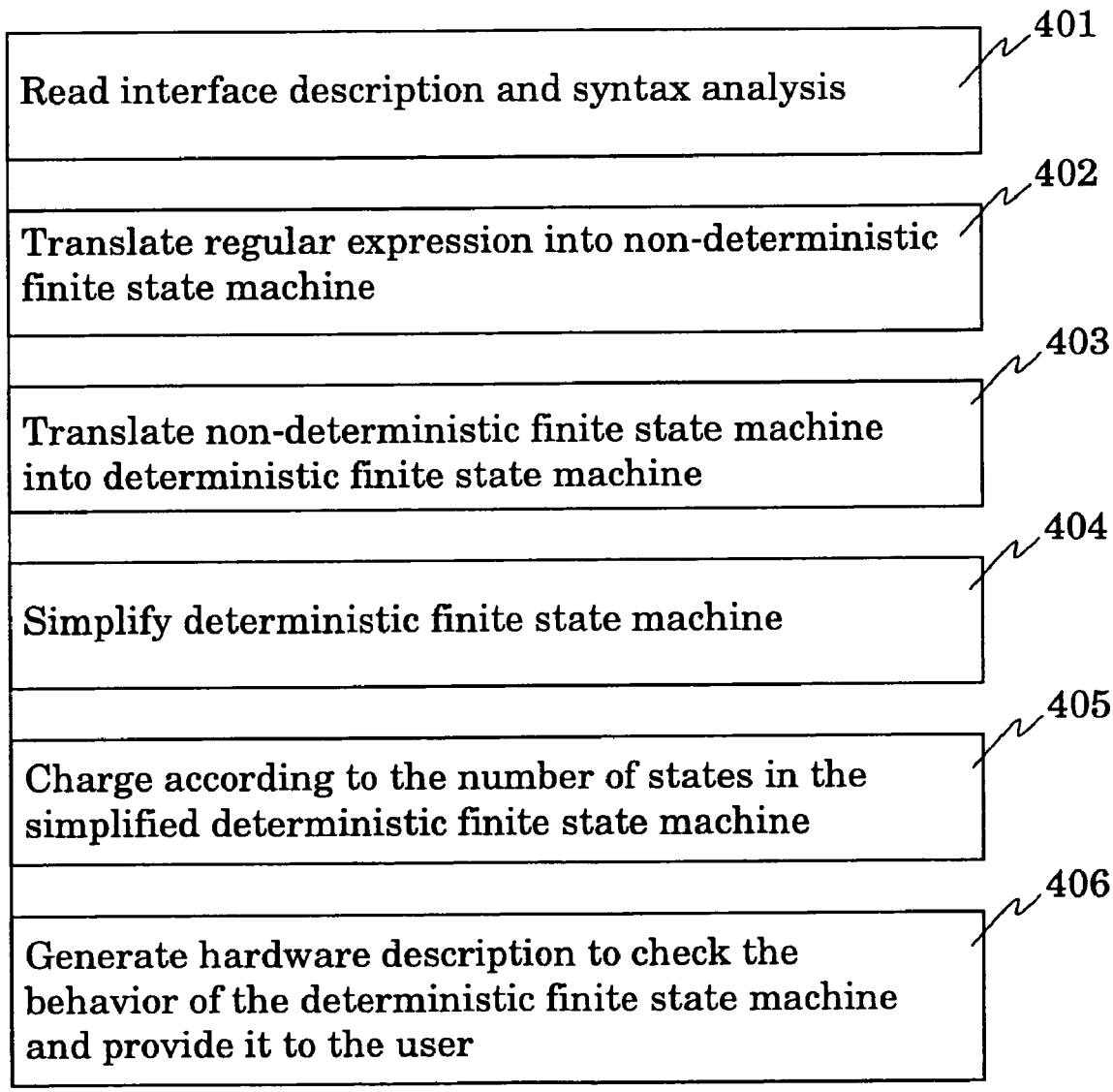
FIG. 4 represents a process flow of another preferred embodiment wherein a charging function is incorporated into the program represented in FIG. 3.

FIG. 4 represents a program execution procedure as a preferred embodiment of the present invention, wherein a function of charging for supplying the hardware description of the synthesizable interface checker generated for a design data interface of user specifications to the user is incorporated in the program whose operation is illustrated in FIG. 3. In steps 401 to 404, reading the interface description, syntax analysis, generating a deterministic finite state machine, and simplification are executed as described for FIG. 3. In step 405, the number of states defined for the simplified deterministic finite state machine is counted and a charge is determined such that the greater the number of states, the greater will be the charge. In step 406, the hardware description to check the operation of the deterministic finite state machine is generated, and this step corresponds to the step 305. In this embodiment, the hardware description of the synthesizable interface checker can be supplied to the user, according to its complexity. When the charging function is incorporated in the program, it is convenient to create a file to contain charging information separate from the program and rewrite the file data when change is made to the charging scheme.

Figure 5:
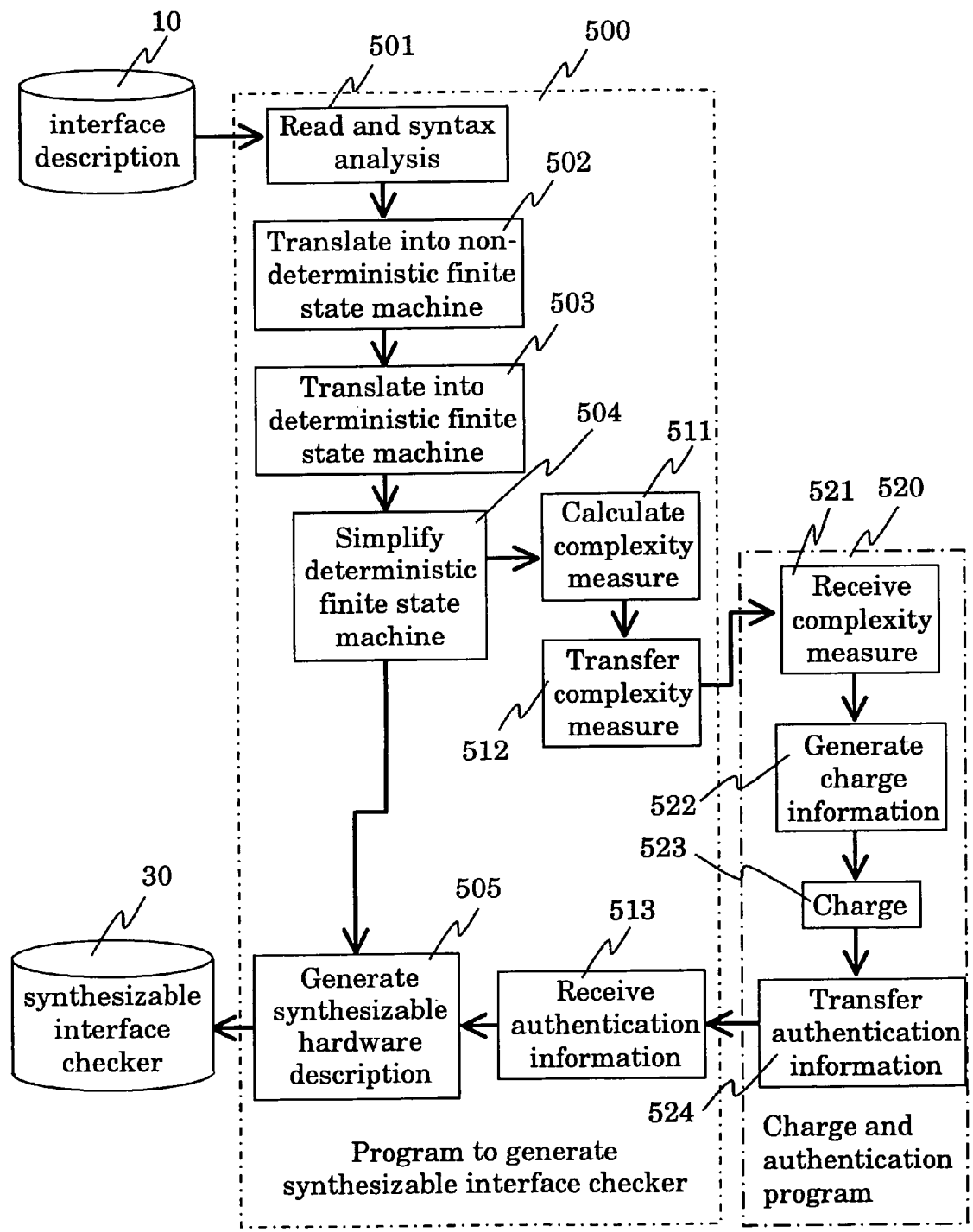
FIG. 5 represents a process flow of a further preferred embodiment wherein a charge and authentication program that is dedicated to the charging function is separately provided.

FIG. 5 is an operation flow diagram representing a further preferred embodiment of the present invention, wherein a charge and authentication program that is dedicated to the charging function is separately provided. According to this embodiment, the main program need not take account of change to the charging scheme, leaving charging to the charge and authentication program.

The overall operation of the program to generate a synthesizable interface checker 500 is the same as described for FIG. 4, except that the charging process in the step 405 is replaced by information transfer to/from the charge and authentication program 520. Specifically, the program executes the following: reading the interface description and syntax analysis (step 501); translating into non-deterministic finite state machine representation (step 502); translating into deterministic finite state machine representation (step 503); simplifying the deterministic finite state machine representation (step 504); and eventually, generating synthesizable hardware description (step 505). In the foregoing embodiment shown in FIG. 4, the program to generate a synthesizable interface checker includes the step 405 for charging according to the number of states defined for the simplified deterministic finite state machine. Instead, the embodiment shown in FIG. 5 includes step 511 in which an index value of complexity is calculated by evaluating the result of the simplified deterministic finite state machine in the step 504, step 512 of transferring the index value to the charge and authentication program 520, and step 513 of receiving authentication information transferred from the charge and authentication program 520. The charge and authentication program 520 links with the program to generate a synthesizable interface checker 500 via a communication path such as the Internet or a leased line so that information is transferred between the programs. The charge and authentication program 520 comprises a step 521 of receiving the index value of complexity transferred from the program to generate a synthesizable interface checker 500, step 522 in which charging information is generated, based on the complexity index value, step 523 in which charging for the article of supply is actually performed, and step 524 in which it is verified that charging has been completed and authentication information that enables the program to generate the synthesizable interface checker is generated and transferred to the program to generate a synthesizable interface checker 500. By configuring the two programs as described above, charging information can be managed at the program provider or the charging service provider, and thus, change to charging can easily be coped with.

Figure 6:
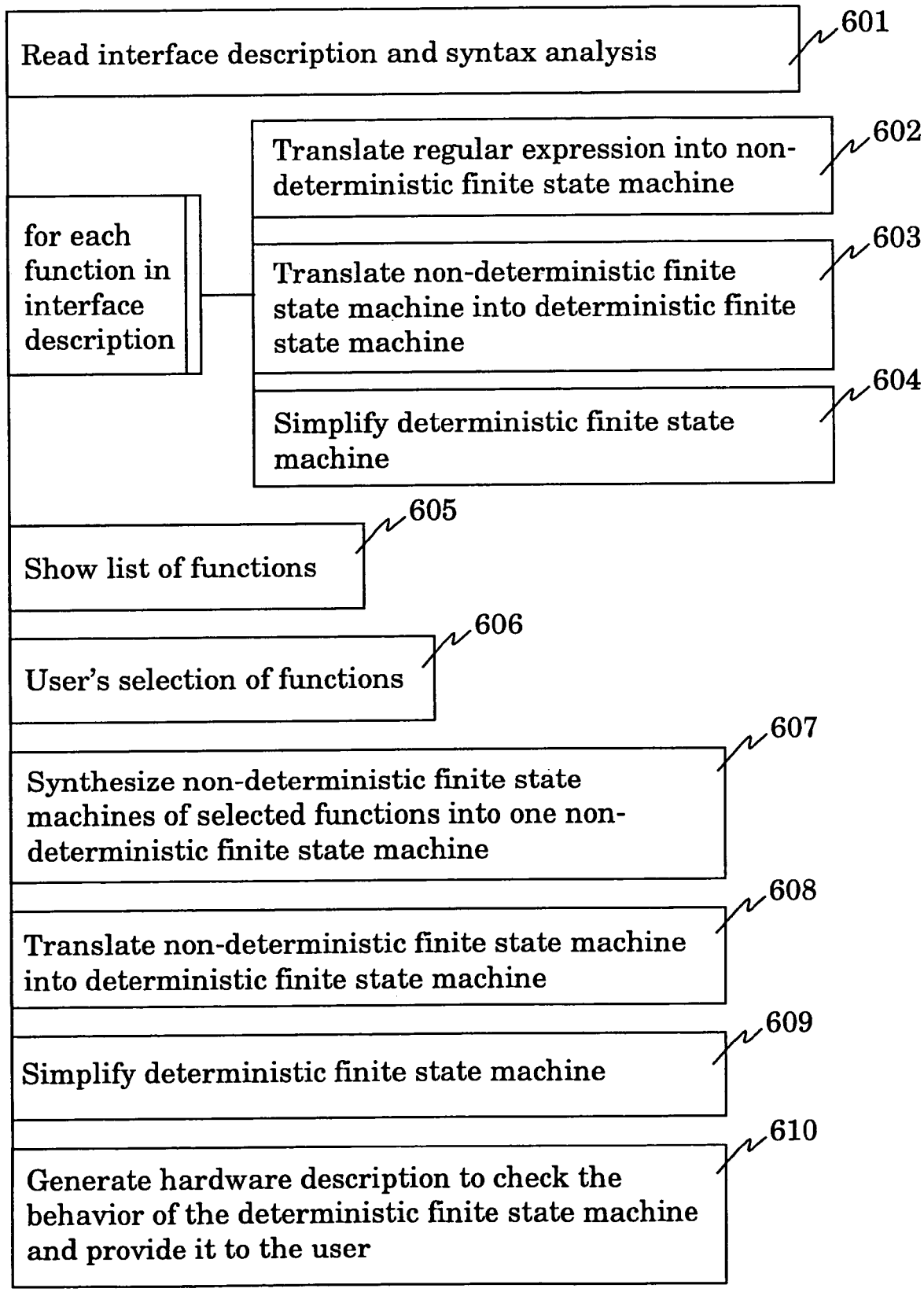
FIG. 6 represents a process flow of a still further preferred embodiment including means for allowing the user to select functions to be checked by a synthesizable interface checker.

FIG. 6 represents a manner in which the program provides the user with means for selecting functions to be checked by the synthesizable interface checker. The design data interface description contains all interface functions of a functional block, but it may be unnecessary to check all functions by the interface checker. In such cases, the above manner allows the user to select desired functions to be checked and the check function checks only the selected functions. In consequence, the amount of the checker description to be generated is reduced and the overhead such as simulation speed and an area of LSI within which the checker is installed can be reduced.

The interface description in accordance with the interface notation of Kokai 2000-123064, as shown in FIG. 10, is described for each function in separate regular expressions. Thus, translating interface description into finite state machine representation and simplification are possible per function. After simplified finite state machines for each function are generated, a list of functions is presented to the user, allowing the user to select desired functions. Eventually, selected functions must be integrated into one synthesizable interface checker. This is preferably accomplished in the procedure below: integrate the simplified finite state machines of the selected functions into one finite state machine; translate the resultant finite state machine to a deterministic finite state machine; again simplify this deterministic finite state machine; and generate a synthesizable interface checker description, according to the above-described translation method. As an illustration, integrating a plurality of finite state machines into one machine is preferably performed in the procedure below: generate a new initial state and, from this initial state, generate epsilon transitions to the initial states of the plurality of finite state machines; and generate a new terminative state and epsilon transitions from the terminative states of the plurality of finite state machines to the new terminative state. In the manner described above, the means for selecting functions by user preference is provided.

The program embodied in FIG. 6 comprises step 601 of reading interface description and syntax analysis, step 602 of translating regular exprssion for each interface function into non-deterministic finite state machine representation, step 603 of translating the non-deterministic finite state machine representation into deterministic finite state machine representation, and step 604 of simplifying the deterministic finite state machine representation. The program further comprises step 605 of showing a list of interface functions described, step 606 of allowing the user to select functions. The program further comprises step 607 of integrating the non-deterministic finite state machines of the selected functions into one non-deterministic finite state machine, wherein integration is performed as illustrated above. The program further comprises step 608 of translating the thus integrated non-deterministic finite state machine into deterministic finite state machine representation and step 609 of simplifying the deterministic finite state machine representation. Finally, the program includes step 610 in which hardware description to check the operation of the simplified deterministic finite state machine is generated and supplied to the user.

Figure 7:
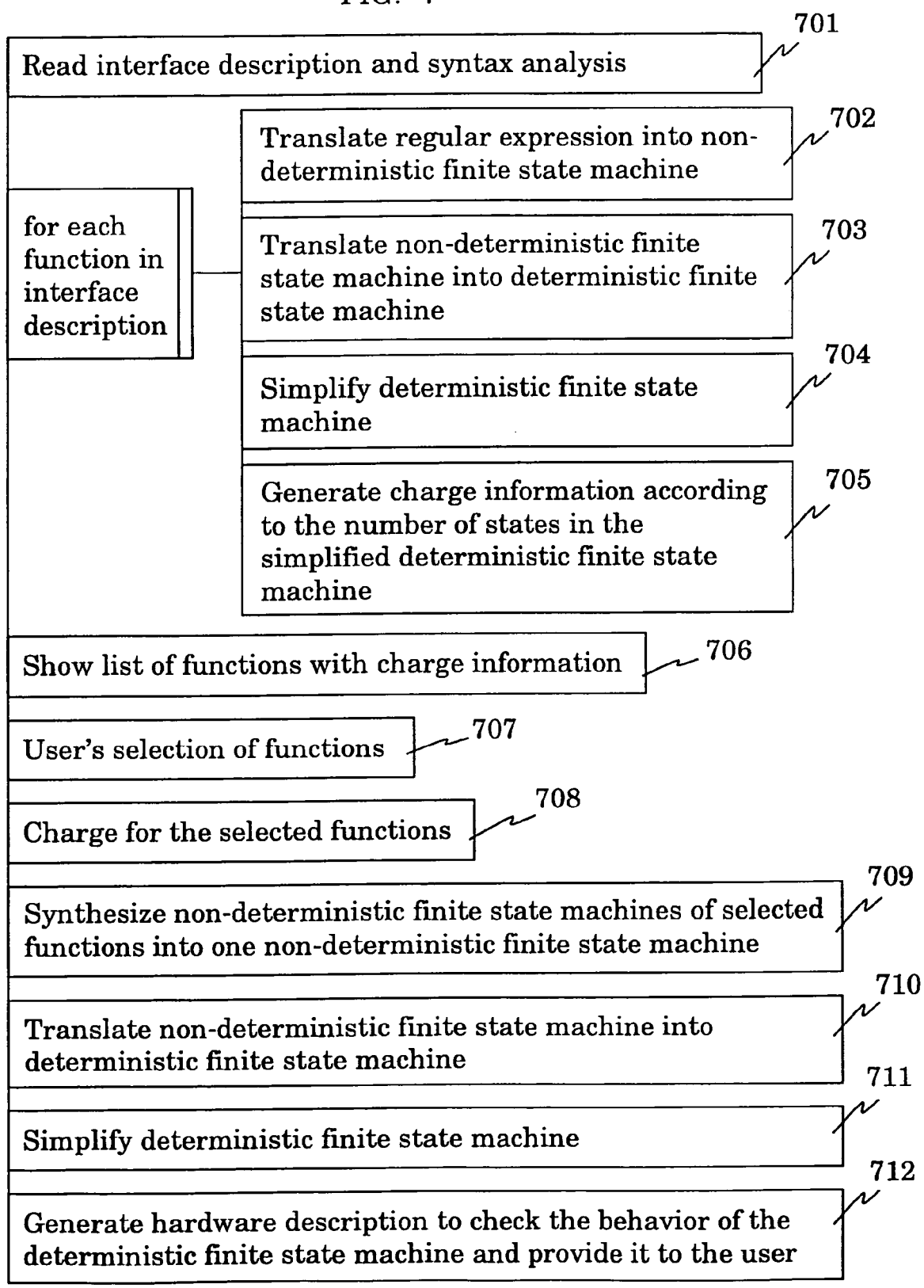
FIG. 7 represents a process flow of yet another preferred embodiment wherein charging for each function checked by the synthesizable interface checker is performed.

When charging for use of this program is implemented, the above-described charging scheme can be applied that is based on the index of complexity such as the number of states defined for the eventually simplified finite state machine or the number of lines of the eventually generated hardware description, as illustrated in FIG. 4. Charging that go in particulars for each selected function is also possible. An illustrative manner thereof is shown in FIG. 7. In this manner, charging information is generated, according to the complexity of the deterministic finite state machine simplified for each function, that is, the number of states defined for the machine and presented to the user when a list of functions are presented. This allows the user to select functions, while referring to the charging information per function. The program embodied in FIG. 7 comprises steps 701 to 704 which correspond to the steps 601 to 604 in FIG. 6 and the procedure from reading the interface description and syntax analysis to simplifying the deterministic finite state machine representation is carried out in these steps. The program further comprises step 705 of generating charging information, according to the number of states defined for the simplified deterministic finite state machine, step 706 of showing a list of interface functions described, as in the corresponding step in FIG. 6, and moreover, showing charging information, step 707 of allowing the user to select functions, as in the corresponding step in FIG. 6, and step 707 of charging for the selected functions. The program further comprises steps 709 to 712 which correspond to the steps 607 to 610 in FIG. 6 and the procedure from integrating the non-deterministic finite state machines of the selected functions into one non-deterministic finite state machine to generating hardware description to check the operation of the simplified deterministic finite state machine and supplying it to the user is carried out in these steps.

Figure 8:
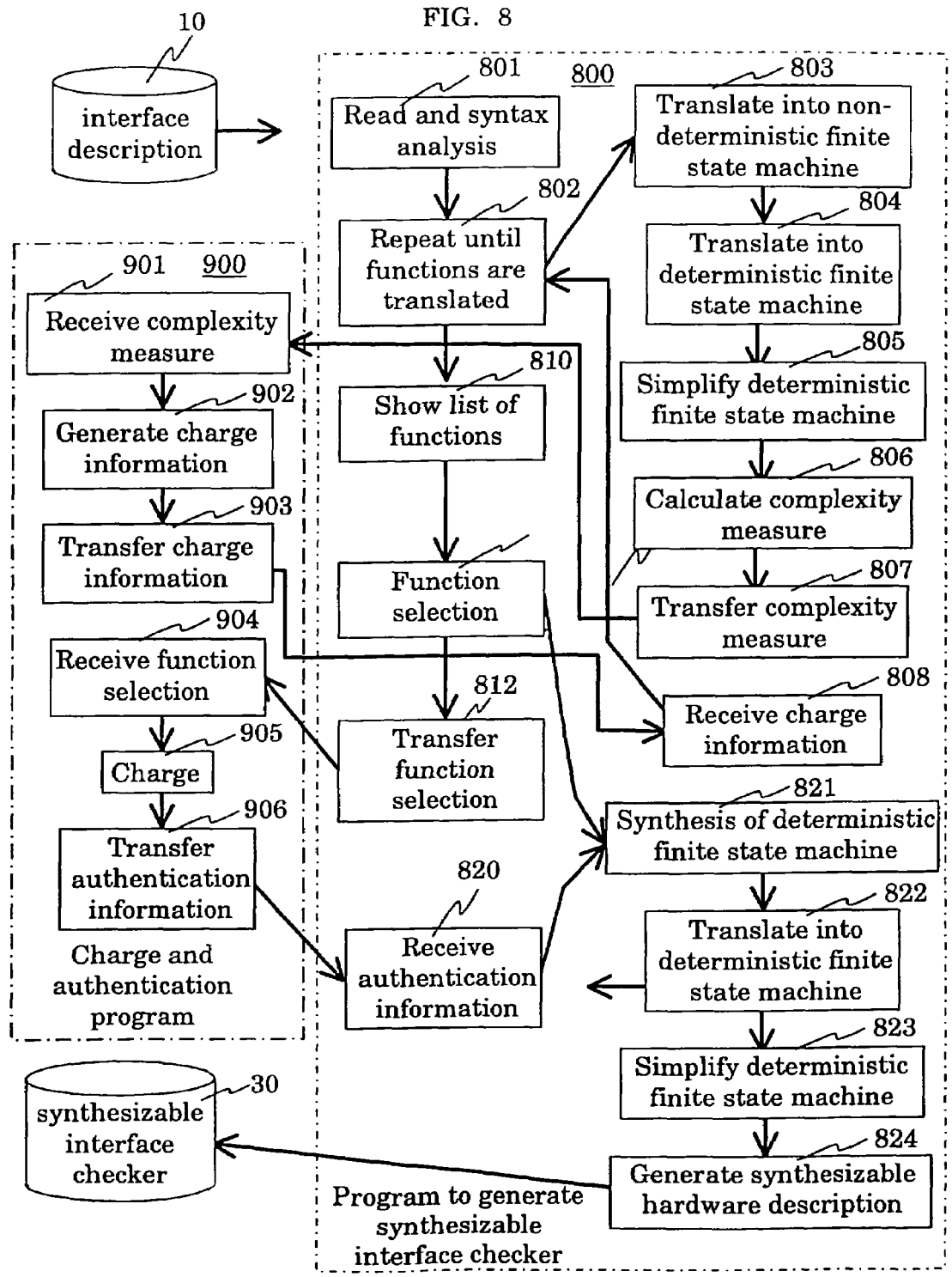
FIG. 8 is a process flow diagram of a further preferred embodiment wherein the function of generating charging information is separated from the main program and assigned to an external charge and authentication program.

The above-described manner in which the function of generating charging information is separated from the program and assigned to an external charge and authentication program and is also applicable to the program embodiment in FIG. 7, so that the program is not engaged in charging. The operation procedure in this manner is shown in FIG. 8. Overall operation flow of the program to generate a synthesizable interface checker 800 embodied in FIG. 8 is generally the same as for the program embodiment in FIG. 7. Because generating charging information, based on the index of complexity of a function is repeated for all functions, the procedure in FIG. 8 appears to be rather complicated. The program comprises step 801 of reading interface description and syntax analysis and step 802 of finding whether the translation process has been completed for all functions, from where the program goes to step 801 if the translation process has not been completed for all functions or step 810 if completed. The program further comprises step 803 of translating regular expression for an interface function into non-deterministic finite state machine representation, step 804 of translating non-deterministic finite state machine into deterministic finite state machine representation, step 805 of simplifying the deterministic finite state machine representation, step 806 of calculating an index value of complexity of the function, step 807 of transferring the index value to the charge and authentication program 900, wherein these steps are executed for each interface function described.

The charge and authentication program 900 links with the program to generate a synthesizable interface checker 800 via a communication path such as the Internet and a leased line and it has a function of data transfer to/from the main program. The charge and authentication program consists of two stages. The first stage comprises a step 901 of receiving the index value of complexity transferred from the program to generate a synthesizable interface checker 800, step 902 of generating charging information, based on the complexity index, and step 903 of transferring the charging information to the program to generate a synthesizable interface checker 800.

Upon receiving the charging information (step 808), the program to generate a synthesizable interface checker 800 returns to the step 802. In this step, checking is made to see whether the translation process has been completed for all functions as described above. If the translation process has not been completed for all functions, the above steps 803 to 808 are repeated. If completed, the program goes to step 810 in which the program shows a list of functions to the user. Step 811 allows the user to select functions. When functions are selected by the user, the functions and information are transferred to step 821 in which the selected functions are integrated into a non-deterministic finite state machine, as in the step 809 in FIG. 7, wherein integration is actually begins only after the authentication information signal is received in step 820 which corresponds to the step 513 described for FIG. 5. When functions are selected by the user, the selected functions and information are also transferred in step 812 to the charge and authentication program 900. A step 904 of the second stage of this program receives the selected functions and information. The charge and authentication program 900 charges for the selected functions (step 905) and transfers authentication information that charging has been performed validly to the program to generate a synthesizable interface checker 800 (step 906).

When the program receives the authentication information, through steps 821 to 824 corresponding to the steps 607 to 610 described for FIG. 6, eventually, hardware description to check the operation of the simplified deterministic finite state machine is generated and supplied to the user.

Using any of the above-described method embodiments, synthesizable interface checker description is generated. Because this description can be synthesized, the interface functions can be installed on a final LSI product by a conventional logic synthesis method. The LSI with the interface checker installed thereon operates at higher speed than LSI simulated operation by logic simulation or emulation. Therefore, mass production and unintentional fault tests using this LSI makes it possible to detect design error which could not be revealed by logic simulation or emulation before mass production and shipment and locate what functional block where error exists.

In the foregoing preferred embodiment shown in FIGS. 1 and 2, the integrated circuit (IC) chip has two functional blocks operating with two design data, respectively, and only the function of checking the interface for one design data was described. However, many functional blocks are actually installed on an IC chip as implied from the descriptions for FIG. 6 to FIG. 8, and therefore, the interface checking block (interface checker) should be given characteristic values that are different for each logic circuit component block. The interface checker checks the patterns of input/output signals predetermined by the specifications for the component blocks. Its function is refined such that, when the interface checker detects a block not conforming to the specifications, it informs the user of nonconformity to the specifications, together with the characteristic values of the block, through the external input/output pin. Thereby, logical ICs with the interface checker function that is more useful in practical use can be produced.

After an LSI with the synthesizable interface checker installed thereon is put into use, when it has been determined that sufficient verification has been completed, the interface checker can be removed. In this way, LSIs performing at higher speed and with smaller area can be produced.

If a system LSI malfunctions and its cause is a design error, the interface checker should remain installed on the circuit. By providing means for implementing this, what functional block where the design error exists can be located. Consequently, responsibility for remedying the error and guarantees can be made clear.

There are various embodiments of the present invention as follows.

1. A method of designing a logical integrated circuit on which a plurality of logic circuit component blocks are connected and installed, said method comprising means for creating an interface checking block that can be synthesized by logic synthesis means, said interface checking block having functions of monitoring input/output signals to/from each of one or more blocks and determining whether the input/output signals conform to input/output signal patterns predetermined by specifications for the block, wherein, when the interface checking block determines that an input/output signal does not conform to the specifications during simulation run of the logical integrated circuit by logic simulation or emulation on a general-purpose computer or specialized device, it outputs a signal indicating nonconformity to the specifications.

2. A method of designing a logical integrated circuit as recited in the above item 1, wherein said interface checking block is given characteristic values which are different for each logic circuit component block, and when the interface checking block detects a block in which an actual input/output signal does not conform to its pattern of the input/output signal patterns predetermined by the specifications for the block, it informs a user of nonconformity to the specifications, together with the characteristic values of the block.

3. A logical integrated circuit on which a plurality of logic circuit component blocks are connected and installed, said logical integrated circuit comprising an interface checking block having functions of monitoring input/output signals to/from one of said blocks and determining whether the input/output signals conform to input/output signal patterns predetermined by specifications for the block, wherein, when the interface checking block determines that an input/output signal does not conform to the specifications, it outputs a signal indicating nonconformity to the specifications through an external input/output pin, the interface checking block being removable when said logical integrated circuit has been judged virtually free of errors.

What is claimed is:

1. A semiconductor integrated circuit device comprising:
   first and second circuit blocks;
   an interface checker which is integrated into the semiconductor integrated circuit device so as to form one simulation model and which monitors whether waveforms of signals between the first and second circuit blocks conform to an interface specification of a design data of the first circuit block via the one simulation model; and
   an external output pin which outputs outside of the semiconductor integrated circuit device a result of a monitoring of the interface checker.

2. The semiconductor integrated circuit device according to claim 1,
   wherein the external output pin outputs a first value indicating a conformity of the waveforms to the interface specification or a second value indicating a nonconformity of the waveforms to the interface specification.

3. The semiconductor integrated circuit device according to claim 1, wherein the interface specification describes timing information in synchronization with a clock signal.

4. A design method of a semiconductor integrated circuit device comprising:
   providing a design data and an interface specification of the design data;
   generating a synthesizable interface checker in accordance with the interface specification;
   producing a semiconductor integrated circuit device including a first circuit block according to the design data and the interface checker according to the synthesizable interface checker, wherein the interface checker is integrated into the semiconductor integrated circuit device so as to form one simulation model; and
   using the interface checker integrated into the semiconductor integrated circuit device via the one simulation model to monitor whether waveforms of signals between the first circuit block and another circuit block conform to the interface specification of the design data.

5. The design method of the semiconductor integrated circuit device according to claim 4, further comprising:
   outputting a first value indicating a conformity of the waveforms to the interface specification or a second value indicating a nonconformity of the waveforms to the interface specification outside of the semiconductor integrated circuit device.

* * * * *